United States Patent [19]

Mendolia

[11] Patent Number: 5,235,293
[45] Date of Patent: Aug. 10, 1993

[54] VARIABLE FREQUENCY MICROWAVE OSCILLATOR INCLUDING DIGITAL PHASE SHIFTER AS TUNING ELEMENT

[75] Inventor: Gregory S. Mendolia, Torrance, Calif.

[73] Assignee: Hughes Aircraft Company, Los Angeles, Calif.

[21] Appl. No.: 906,322

[22] Filed: Jun. 30, 1992

[51] Int. Cl.$^5$ .................. H03B 5/12; H03B 5/18; H03B 7/14

[52] U.S. Cl. ................... 331/96; 331/99; 331/115; 331/117 D; 331/177 V; 331/179

[58] Field of Search .............. 331/96, 99, 107 SL, 331/115, 117 D, 177 R, 177 V, 179; 332/129, 130, 136

[56] References Cited

U.S. PATENT DOCUMENTS 5,150,080 9/1992 Bianchini et al. ................ 331/96 X

OTHER PUBLICATIONS

"GaAs MESFET Circuit Design", edited by R. Soares, published by Artech House, 1988, pp. 347–348.
"A Compact Broadband, Six-Bit MMIC Phasor with Integrated Digital Drivers", by C. Moye et al., 1990 IEEE MTT-S Digest, pp. 457–459.

*Primary Examiner*—Siegfried H. Grimm
*Attorney, Agent, or Firm*—Terje Gudmestad; W. K. Denson-Low

[57] ABSTRACT

A resonator (50) is connected in circuit with a negative resistance element (Q3,Q4) for producing oscillation at a resonant frequency of the resonator (50). A digital phase shifter (58) is incorporated into the resonant frequency in accordance with an applied digital signal. The resonator (50) can be connected in series with the negative resistance element (Q3), in which case the phase shifter (58) is connected as either a short-circuit or an open-circuit transmission line. Alternatively, the resonator (50) can be connected in parallel with the negative resistance element (Q4) in a feedback loop. An analog phase shifter (84) can also be provided in the resonator (50') for continuously variably setting the resonant frequency over the tuning increments of the digital phase shifter (58).

20 Claims, 5 Drawing Sheets

VARIABLE FREQUENCY MICROWAVE OSCILLATOR INCLUDING DIGITAL PHASE SHIFTER AS TUNING ELEMENT

BACKGROUND OF THE INVENTION

1. Field of the Invention

The present invention generally relates to the field of microwave frequency oscillators, and more specifically to a variable frequency oscillator which includes a digital phase shifter as a tuning element and can be advantageously utilized in a monolithic microwave integrated circuit (MMIC).

2. Description of the Related Art

Analog voltage-controlled oscillators (VCOs) are widely used as sources of signals at microwave frequencies. The resonant circuits in these oscillators generally include a variable capacitance diode or varactor as a tuning element. The capacitance of the varactor and thereby the resonant frequency of the oscillator vary in accordance with the value of an analog control voltage applied to the varactor.

An example of a prior art microwave oscillator which is conventionally used in MMIC applications is illustrated in FIG. 1 and generally designated as 10. A resonant circuit or resonator 12 is connected in series with a negative resistance element in the form of a field effect transistor (FET) Q1. More specifically, the resonator 12 has one terminal 14 connected through a gate matching network 16 to the gate of the FET Q1 and a second terminal 18 connected to ground, and bias is supplied to D1 through a radio frequency (RF) blocking choke L1 and an RF bypass capacitor C1.

The resonator 12 includes a transmission line segment 20 which is connected in series with an inductor L2 between the terminals 14 and 18. The segment 20 represents the length of transmission line required to interconnect the resonator 12 with the other elements of the oscillator 10, and can be inductive or capacitive depending on its length and the frequency of oscillation. A DC blocking capacitor C2 is connected in series with a variable capacitance diode or varactor D1 in parallel with the inductor L2.

The FET Q1 is connected in a common-source configuration with its source connected to ground through a source matching network 22. The drain of the FET Q1 is connected through an output matching network 24 to an output terminal 26. Although not illustrated, the FET Q1 can also be connected in common-drain and common-gate configurations.

The oscillator 10 is known in the art as a "negative resistance" type amplifier. The inductor L2 and varactor D1 constitute the main elements of a parallel resonant circuit having a resonant frequency determined by the inductance of the inductor L2 and the capacitance of the varactor D1. Oscillation is initiated and sustained in the resonant circuit 12 and an oscillating signal coupled to the output terminal 26 due to the negative resistance of the FET Q1. The general principles of negative resistance amplifiers are set forth in a textbook entitled "GaAs MESFET Circuit Design", edited by R. Soares, published by Artech House, 1988. pp. 347-348.

The capacitance of the varactor D1 is variably set and the frequency of oscillation of the oscillator 10 is correspondingly variably set by applying an analog DC control or tuning voltage Vc to the terminal 18. A controller 28, which may be a conventional microprocessor, includes a central processing unit 30, a read-write or random-access memory (RAM) 32 and a program memory 34 which can be either read-write or read-only (ROM). A look-up table which contains values of the tuning voltage Vc and the oscillator frequency which results from application of the corresponding tuning voltage Vc to the varactor D1 are stored in a table memory 36. Although not illustrated, the table may alternatively be stored in the ROM 34 or RAM 32.

To select a desired frequency of oscillation of the oscillator 10, a command is entered into the CPU 30 from a keyboard or the like (not shown) designating the desired frequency. The CPU 30 accesses the table ROM 36 with the designated frequency and retrieves the value of tuning voltage Vc which corresponds to the accessed frequency. The CPU 30 then applies a digital code corresponding to the retrieved tuning voltage Vc to a digital-to-analog converter 38 which converts the code into the analog tuning voltage Vc and applies the voltage Vc to the varactor D1 via the terminal 18.

FIG. 2 illustrates a similar prior art microwave oscillator 10' in which a resonator 12' and negative resistance element in the form of an NPN type bipolar transistor Q2 are connected in a parallel. Like elements are designated by the same reference numerals as in FIG. 1, and corresponding but modified elements are designated by the same reference numerals primed.

The transistor Q2 is connected in a common-emitter amplifier configuration, although common-collector and common-base arrangements are also conventionally used. The resonator 12' is connected in the feedback path of the amplifier, between the collector and base of the transistor Q2. The varactor D1 and an inductor L2' constitute the main elements of a series resonant circuit, and are connected in series with a transmission line segment 20' between terminals 14' and 18'. Further illustrated is a DC blocking choke L3 which is connected from the junction of the varactor D1 and transmission line segment 20' to ground.

The operation of the oscillator 10' is similar to that of the oscillator 10, except that oscillation is initiated and sustained in the resonant circuit 12' and an oscillating signal coupled to the output terminal 26 due to positive feedback from the collector to the base of the transistor Q2.

Where the varactor D1 is a conventional regular-abrupt varactor diode, the frequency tuning range of the oscillators 10 and 10' is limited to approximately 5-10% due to limited capacitance range. In addition, the control voltage Vc is generally limited to a relatively small range, on the order of 10 volts. The tuning range can be increased by utilizing a hyper-abrupt varactor diode which has a larger range of capacitance, on the order of 40-50%. However, the phase noise of a hyper-abrupt varactor diode is much higher due to lower quality factor (Q).

Advanced applications such as Near Obstacle Detection Systems (NODS) for automobiles and other vehicles utilize Doppler radars including MMIC transceivers. The oscillators for the transceivers must have a precise and stable center frequency, and must be capable of highly linear monotonic frequency stepping under digital control. These goals are difficult to attain with an analog VCO. Due to practical processing tolerances, it is extremely difficult to accurately set the center frequency of the oscillator at a design value. External tuning using laser scribing or the like is required for setting the center frequency. This is a complex and expensive processing step, and is impractical where large quantities of products must be manufactured at low unit cost. Production yield losses due to frequency inaccuracy can be very high.

Varactor diodes also have highly non-linear voltage/capacitance characteristics, making it extremely difficult to provide linear frequency stepping. The table memory 36 is therefore an essential part of the oscillator 10 or 10', and generation of the table in view of the non-linearities involved is difficult on a commercial production basis.

SUMMARY OF THE INVENTION

A variable frequency microwave digitally-controlled oscillator (DCO) embodying the present invention includes a resonator connected in circuit with a negative resistance element for producing oscillation at a resonant frequency of the resonator. A digital phase shifter is incorporated into the resonator as a tuning element for varying the resonant frequency in accordance with an applied digital signal.

The resonator can be connected in series with the negative resistance element, in which case the phase shifter is connected as either a short-circuit or an open-circuit transmission line. Alternatively, the resonator can be connected in parallel with the negative resistance element in a feedback loop. An analog phase shifter can also be provided in the resonator for continuously varying the resonant frequency over the tuning increments of the digital phase shifter.

The present DCO does not require an analog control voltage for tuning, but accepts direct digital signals, thereby eliminating the need for a DAC as is required in a prior art analog VCO. In addition, the present DCO is not subject to limited voltage or varactor capacitance ranges.

The digital phase shifter in the DCO provides a large oscillator frequency range with high linearity, enabling accurate frequency stepping over the entire range. An octave (factor of two) of tuning is easily attainable. The oscillator center frequency can be set digitally, thereby eliminating the undesirable laser trimming step which is required for prior art analog VCOs.

The present oscillator is fully compatible with current MMIC processing technology, or flip-chip MMIC technology, using either microstrip or coplanar circuitry.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
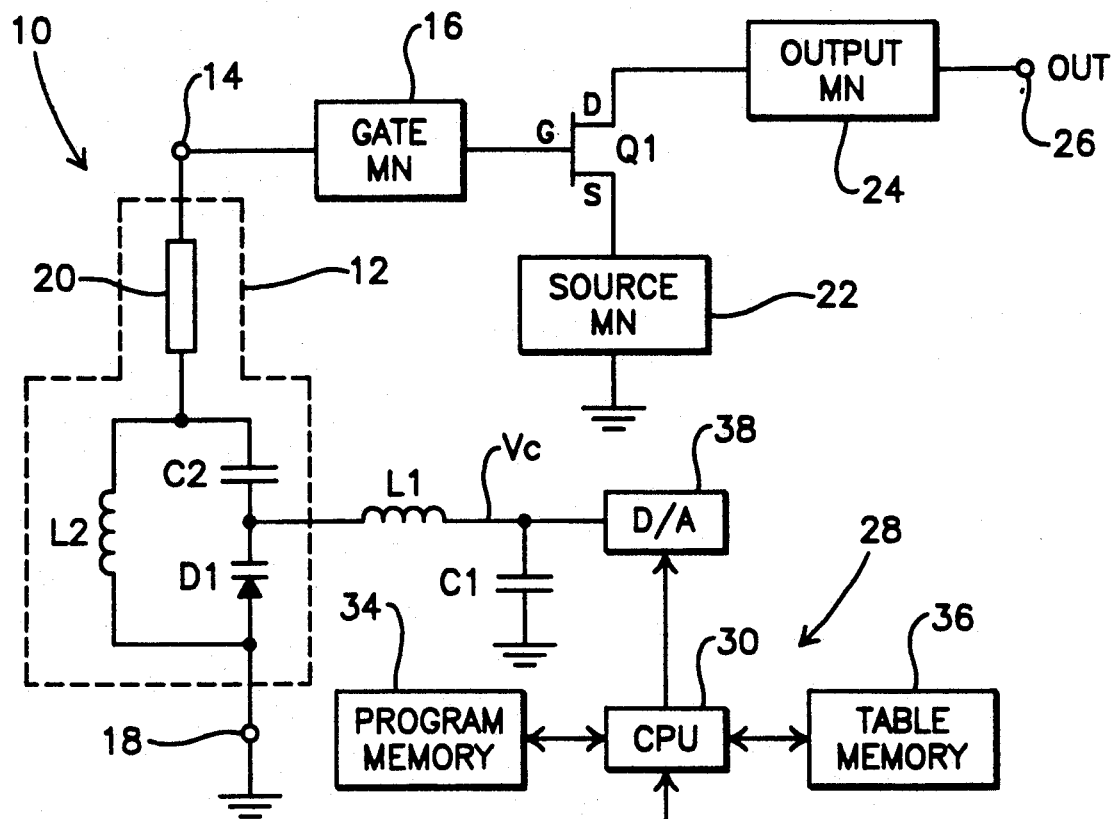
FIG. 1 is a simplified circuit diagram illustrating a prior art analog voltage-controlled oscillator (VCO) in a series or negative resistance configuration.
Figure 3:
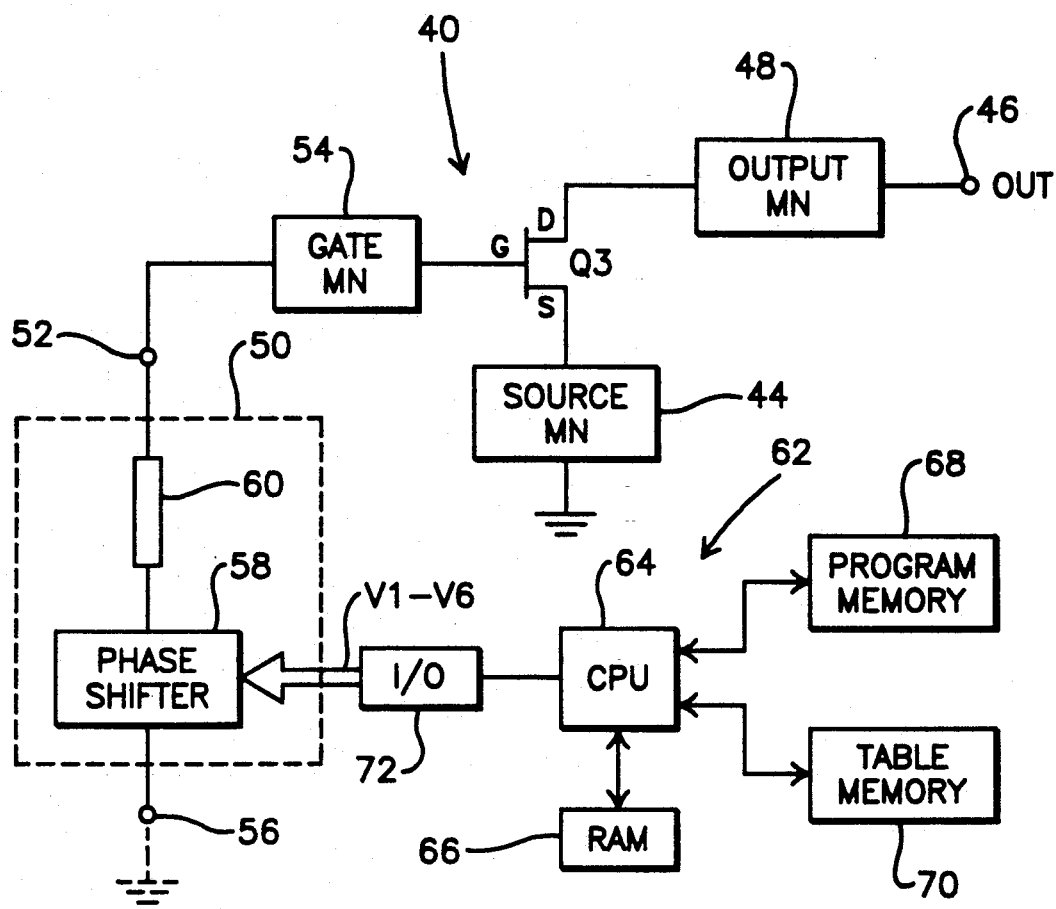
FIG. 3 is a simplified circuit diagram illustrating a digitally-controlled oscillator (DCO) embodying the present invention in a series or negative resistance configuration.

A digitally-controlled oscillator (DCO) for microwave applications is illustrated in FIG. 3 and generally designated as 40. The oscillator 40 has a negative resistance configuration as described above with reference to FIG. 1, and includes a negative resistance element in the form of a field-effect transistor (FET) Q3 having a source connected to ground through a source matching network 44. The drain of the FET Q3 is connected to an output terminal 46 through an output matching network 48.

The FET Q3 is connected in a common-source configuration. Common-drain and common-gate configurations are also possible, although not specifically illustrated. It is further within the scope of the invention to replace the FET Q3 with a bipolar transistor or other negative resistance element. The oscillator 40 further includes a resonant circuit or resonator 50 having a terminal 52 connected through a gate matching network 54 to the gate of the FET Q3. The resonator 50 has another terminal 56 which may be connected to ground or left unconnected.

In accordance with the present invention, the resonator 52 includes a digital phase shifter 58 connected in series with a transmission line segment 60 between the terminals 52 and 56. The segment 60 represents the length of transmission line interconnecting the resonator 50 with the other elements of the oscillator 40, and can be inductive or capacitive depending on its length and the frequency of oscillation.

Figure 4:
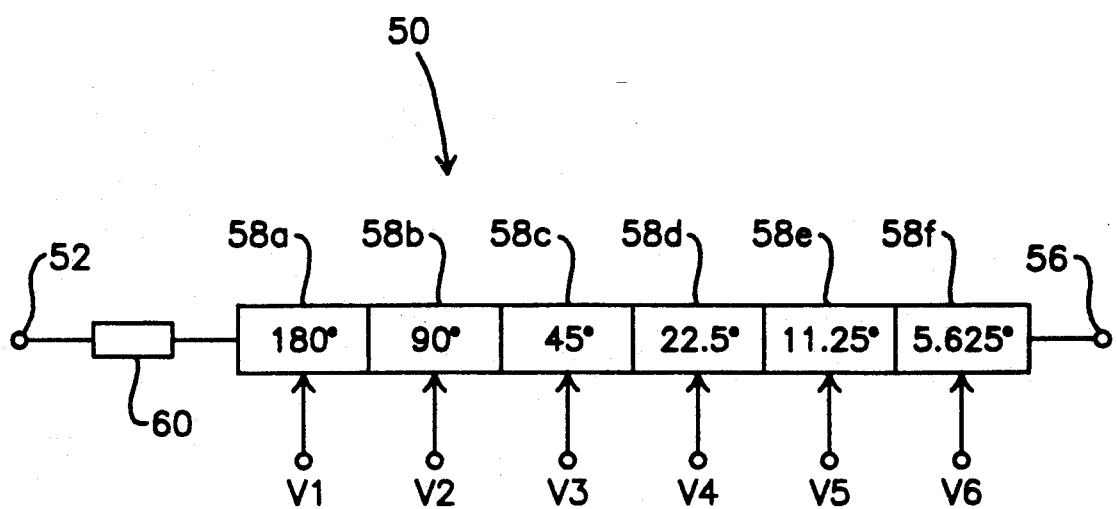
FIG. 4 is a diagram illustrating a resonator circuit of the oscillator of FIG. 4.

The resonator 50 is illustrated in more detail in FIG. 4. The phase shifter 58 is shown as including six phase bits 58a–58f, although any desired number of phase bits can be used within the scope of the invention. Six phase bits provide $2^6 = 64$ increments of phase shift, with the minimum step between increments being 5.625° of electrical length. The bits 58a–58f are individually controlled by binary control signals V1–V6 which are applied to the phase shifter 58 as a parallel six-bit digital code.

When one of the signals V1–V6 is logically high, the respective phase bit 58a–58f is turned on, and vice-versa. When the bits 58a–58f are turned on, they provide phase delays of 180°, 90°, 45°, 22.5°, 11.25° and 5.625° respectively which can be combined in any of 64 combinations as indicated above. When the bits 58a–58f are turned off, they provide a phase delay of 0°. The construction of the phase shifter 58 is not the particular subject matter of the present invention. An exemplary phase shifter configuration which is suitable for practicing the invention is described in an article entitled "A COMPACT BROADBAND, SIX-BIT MMIC PHASOR WITH INTEGRATED DIGITAL DRIVERS", by C. Moye et al, 1990 IEEE MTT-S Digest, pp. 457–459.

The present oscillator 40 further includes a controller 62 which may be a conventional microprocessor, and includes a central processing unit 64, a read-write or random-access memory (RAM) 66, and a program memory 68 which can be either read-write or read-only (ROM). A look-up table which contains values of the control signals V1-V6 and the oscillator frequency which results from application of the corresponding signals V1-V6 to the phase shifter 58 are stored in a table memory 70. Although not illustrated, the table may alternatively be stored in the program memory 68 or RAM 66. The CPU 64 applies the signals V1-V6 to the phase shifter 58 through a buffer or input-output unit (I/O) 72.

In operation, a frequency of oscillation of the oscillator 40 is selected and input to the CPU 64 via a keyboard or the like (not shown). The CPU 64 accesses the table in the memory 70 with the selected frequency, and retrieves the corresponding value of the signals V1-V6 corresponding to the accessed frequency. The CPU 64 applies the retrieved signals V1-V6 through the I/O unit 72 to the phase shifter 58, which sets the oscillation frequency to the selected value.

Where the terminal 56 is connected to ground, the resonator 50 including the phase shifter 58 and segment 60 in series constitutes a short-circuit transmission line connected to the negative resistance element constituted by the FET Q3. At microwave frequencies, such a transmission line acts as a waveguide.

The wavelength $\lambda$ of the oscillator signal is related to the oscillator frequency f as $\lambda = c/f$, where c is the speed of light. Where the length of the resonator 50 is between 0 and $\lambda/4$, the resonator 50 or equivalent waveguide acts as an inductance. At $\lambda/4$, the resonator 50 acts as an open or series resonant circuit. Between $\lambda/4$ and $\lambda/2$, the resonator 50 acts as a capacitance. At $\lambda/2$, the resonator 50 acts as a short or parallel resonant circuit. This relationship repeats at intervals of $\lambda/2$.

Thus, the resonator 50 can be variably set to resonate at a selected frequency by adjusting the electrical length, or equivalently the physical length of the phase shifter 58. It is generally desirable to utilize the $\lambda/4$ open circuit or series resonant mode for tuning in order to maximize the bandwidth and preclude higher mode oscillation. It is, however, within the scope of the present invention to use a higher resonant mode at a multiple of $\lambda/4$ where it is desired to provide smaller bandwidth, higher quality factor (Q) and better noise performance.

The gate of the FET Q3 is capacitive, and the length of the segment 60 is preferably selected to have an electrical length between 0 and $\lambda/4$ which provides a value of inductance to exactly cancel the capacitive reactance at the gate of the FET Q3. Thus, the reactance seen by the phase shifter 58 is zero, and the resonator 50 has a large value of Q.

The phase shifter 58 is designed, in combination with the segment 60, to cover the desired range of oscillator frequency. The design of the resonator 50 varies depending on the particular application, and generally involves nonlinear variables. However, computer programs are commercially available which solve the equations required for design of the resonator 50. A representative example is the "Super Compact" program by Compact Software of Patterson, NJ. Assuming that the segment 60 has a length of 0.762 mm, the phase shifter 58 has a physical length of 5 mm at 360° of phase shift and the phase shifter produces a phase shift of 90° at 11 GHz, the resonant frequency range of the resonator 50 as calculated by the Super Compact program is 15.5 GHz (0° phase shift) to 8.1 GHz (360° phase shift).

The relationships described above are reversed where the terminal 56 is unconnected and the resonator 50 acts as an open-circuit transmission line. Between 0 and $\lambda/4$, the resonator 50 or equivalent waveguide acts as a capacitance. At $\lambda/4$, the resonator 50 acts as a short or parallel resonant circuit. Between $\lambda/4$ and $\lambda/2$, the resonator 50 acts as an inductance. At $\lambda/2$, the resonator 50 acts as an open or series resonant circuit. This relationship repeats at intervals of $\lambda/2$.

It is further within the scope of the invention to select the length of the phase shifter 58 such that it operates as an inductor over its range of phase variation. In this case, the phase shifter 58 will be connected in series with a capacitor (not shown) to constitute a series resonant circuit. It is also possible to select the length of the phase shifter 58 such that it operates as a capacitor over its range of phase variation. In this case, the phase shifter 58 will be connected in series with an inductor (not shown) to constitute a series resonant circuit.

In commercial production, the table memory 70 will preferably be embodied by an erasable-programmable read-only memory (EPROM). After fabrication of the oscillator 40, all combinations of the signals V1-V6 are applied to the phase shifter 58, and the resulting oscillator frequencies are measured and stored as a table in the memory 70 along with the corresponding values of the signals V1-V6. The measured frequencies may be rounded off if desired to facilitate access of the table by the CPU 64. In this manner, compensation for manufacturing tolerances is performed automatically, and the value of the signals V1-V6 required to produce a desired frequency of oscillation are precisely determined for each oscillator 40 as manufactured. The center frequency, or any other selected frequency of the oscillator 40 can be variably set merely by accessing the selected frequency in the table memory 70. Frequency stepping is also easily achieved by direct memory access.

Figure 5:
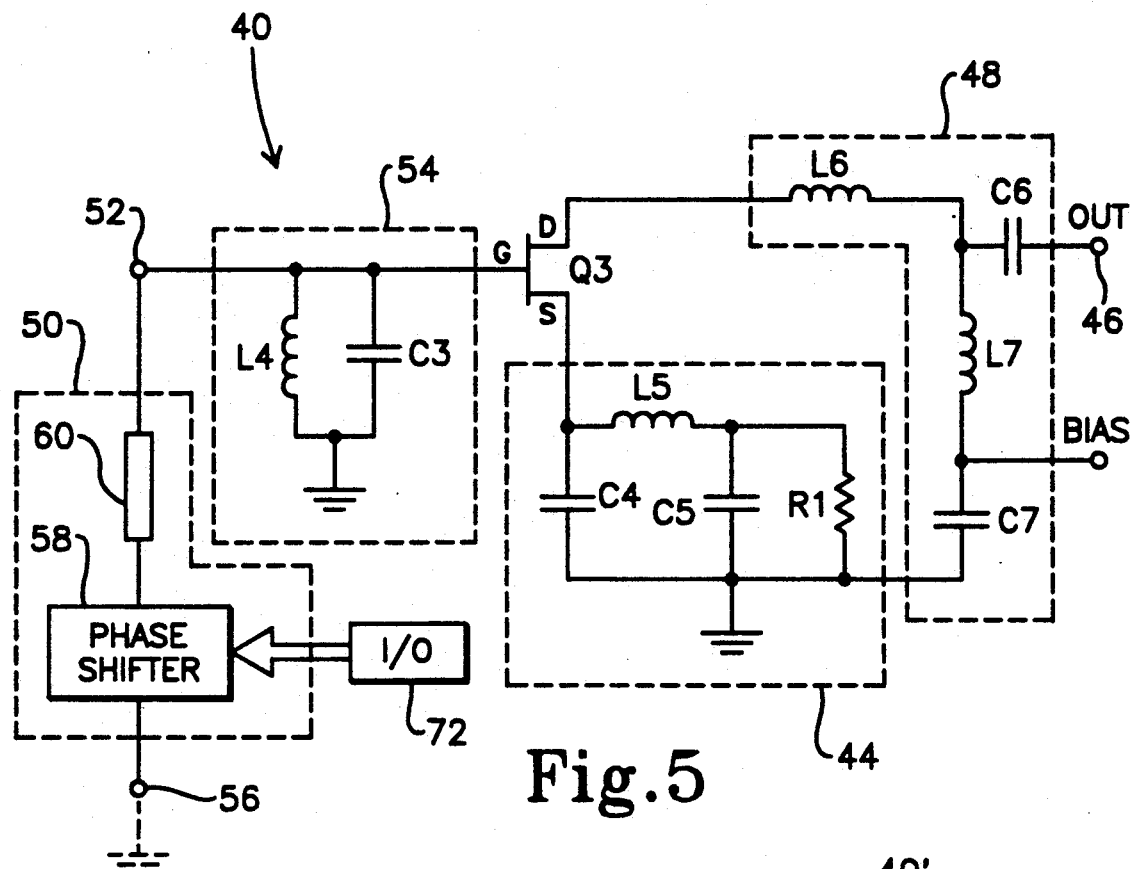
FIG. 5 is a more detailed circuit diagram of the oscillator of FIG. 3.

The oscillator 40 is illustrated in more detail in FIG. 5. The gate matching network 54 includes an inductor L4 and a capacitor C3 which are connected in parallel between the terminal 52 and ground. The inductor L4 acts as a DC blocking choke and ground return, and the capacitor C3 acts as an RF shunt to ground.

The source matching network 44 includes a capacitor C4 which is connected between the source of the FET Q3 and ground and acts as an RF shunt to ground. An inductor L5 and a capacitor C5 are connected in series across the capacitor C4. The inductor L5 acts as an RF blocking choke and the capacitor C5 acts as an RF bypass. A resistor R1 is connected in parallel with the capacitor C5 to provide self-bias for the source of the FET Q3.

The output matching network 48 includes an inductor L6 and a capacitor C6 which are connected in series between the drain of the FET Q3 and the output terminal 46. The inductor L6 provides RF matching and the capacitor C6 provides DC blocking. An inductor L7 and capacitor C7 are connected in series between the terminal 46 and ground. The inductor L7 provides RF matching and couples a BIAS voltage to the drain of the FET Q3. The capacitor C7 bypasses undesired RF to ground.

Figure 6:
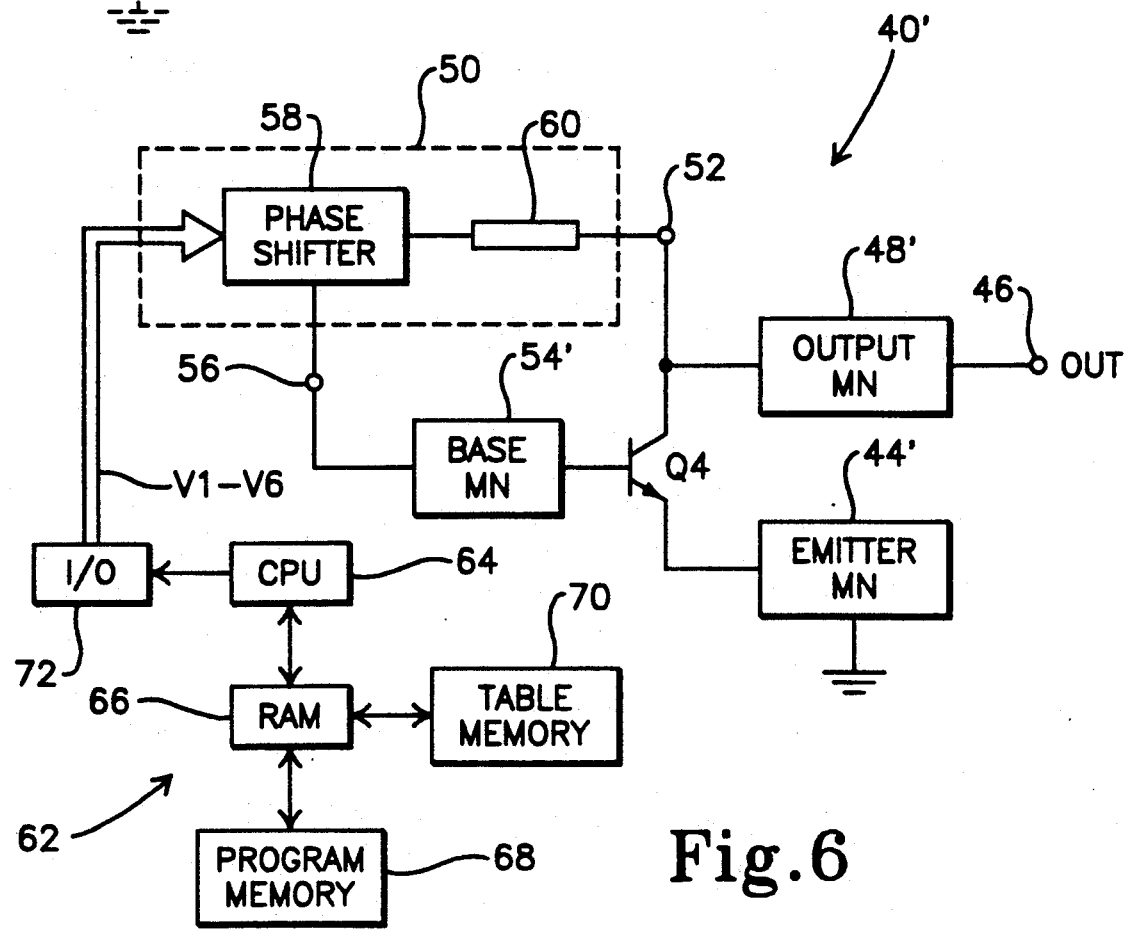
FIG. 6 is similar to FIG. 3, but illustrates the present DCO in a parallel or feedback configuration.

FIG. 6 illustrates another embodiment of the present oscillator designated as 40′, in which the resonator 50 and negative resistance element in the form of an NPN type bipolar transistor Q4 are connected in a parallel. Like elements are designated by the same reference numerals as in FIG. 3, and corresponding but modified elements are designated by the same reference numerals primed.

The transistor Q4 is connected in a common-emitter amplifier configuration, although common-collector and common-base arrangements are also possible. The transistor Q4 may also be replaced by an FET or other negative resistance or amplifying element. The resonator 50 is connected in the feedback path of the amplifier, between the collector and base of the transistor Q4. The operation of the oscillator 40' is similar to that of the oscillator 40, except that oscillation is initiated and sustained in the resonant circuit 50 and an oscillating signal coupled to the output terminal 46 due to positive feedback from the collector to the base of the transistor Q4.

Figure 7:
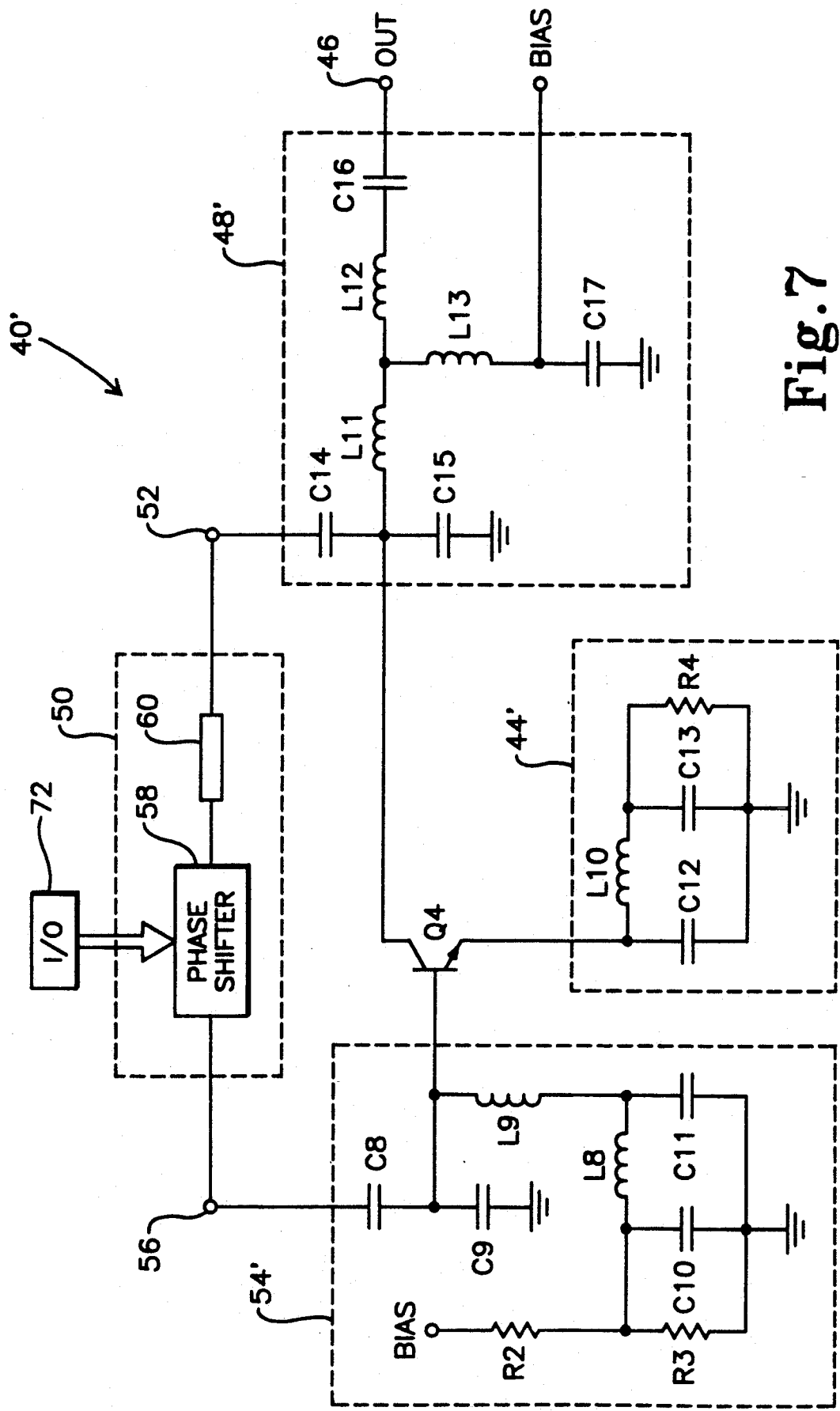
FIG. 7 is a more detailed circuit diagram of the oscillator of FIG. 6.

The oscillator 40' is illustrated in more detail in FIG. 7. A base matching network 54' includes a DC blocking capacitor C8 connected between the terminal 56 and the base of the transistor Q4, and an RF matching capacitor C9 connected between the base of the transistor Q4 and ground. A voltage divider including resistors R2 and R3 drop the BIAS voltage to a suitable value for biasing the base of the transistor Q4. An RF bias capacitor C10 is connected between the junction of the resistors R2 and R3 and ground. An inductor L8 and capacitor C11 are connected in series across the capacitor C10. The inductor L8 acts as an RF blocking choke and DC bias return and the capacitor C11 provides RF matching. An RF matching inductor L9 is connected between the junction of the inductor L8 and capacitor C11 and the base of the transistor Q4. The base matching network 54' therefore provides positive feedback between the collector and base of the transistor Q4 through the resonator 50, and a bias voltage for the base of the transistor Q4.

An emitter matching network 44' includes a capacitor C12 which is connected between the emitter of the transistor Q4 and ground and provides RF matching. An inductor L10 and a capacitor C13 are connected in series across the capacitor C12. The inductor L10 acts as an RF blocking choke and DC bias return, and the capacitor C5 acts as an RF bypass. A resistor R4 is connected in parallel with the capacitor C13 to provide self-bias for the emitter of the transistor Q4.

An output matching network 48' includes a DC blocking capacitor C14 connected between the terminal 52 and the collector of the transistor Q4, and an RF matching capacitor C15 connected between the collector of the transistor Q4 and ground. RF matching inductors L11 and L12 and a DC blocking capacitor C16 are connected in series between the collector of the transistor Q4 and the terminal 46.

An inductor L13 and a capacitor C17 are connected in series between the junction of the inductors L11 and L12 and ground. The BIAS voltage is applied to the junction of the inductor L13 and capacitor C17. The inductor L13 provides RF matching and couples the BIAS voltage to the collector of the transistor Q4, and the capacitor C17 provides RF blocking.

Figure 2:
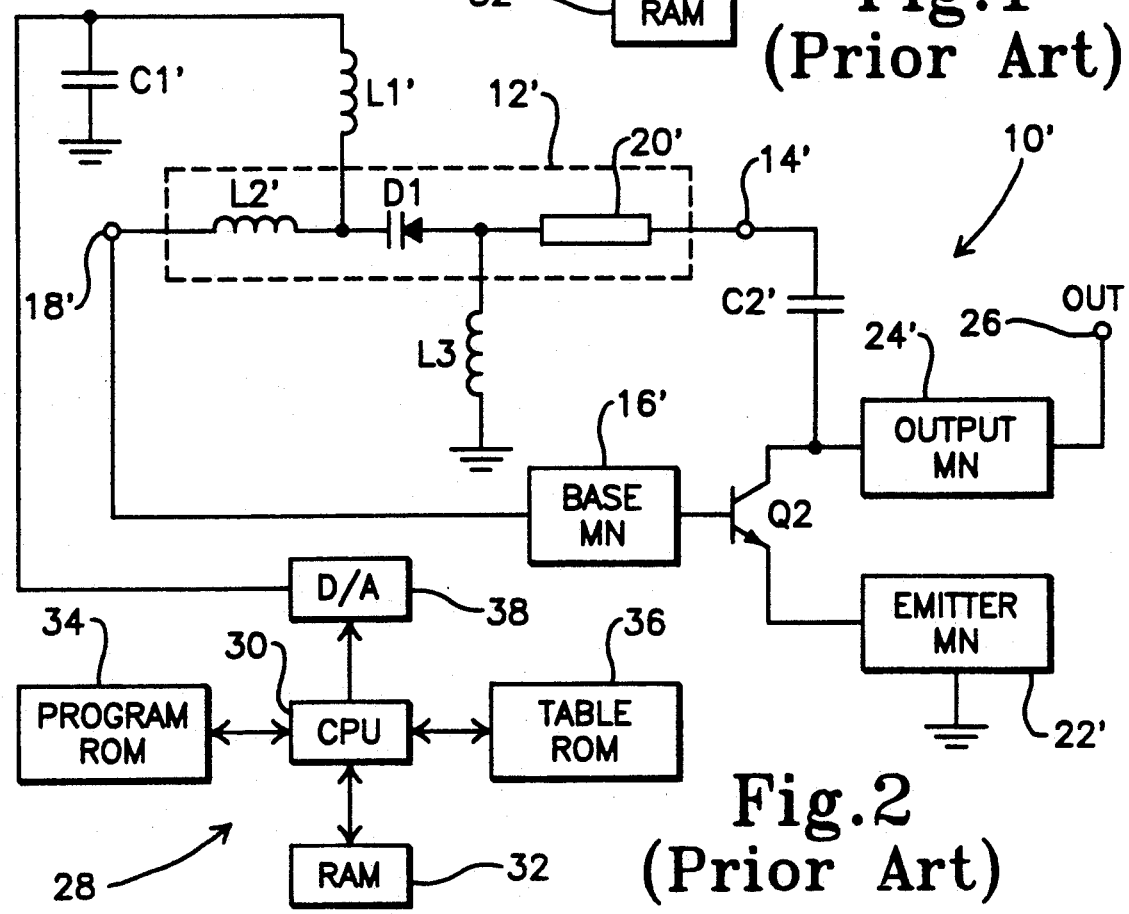
FIG. 2 is similar to FIG. 1, but illustrates a prior art VCO in a parallel or feedback configuration.
Figure 8:
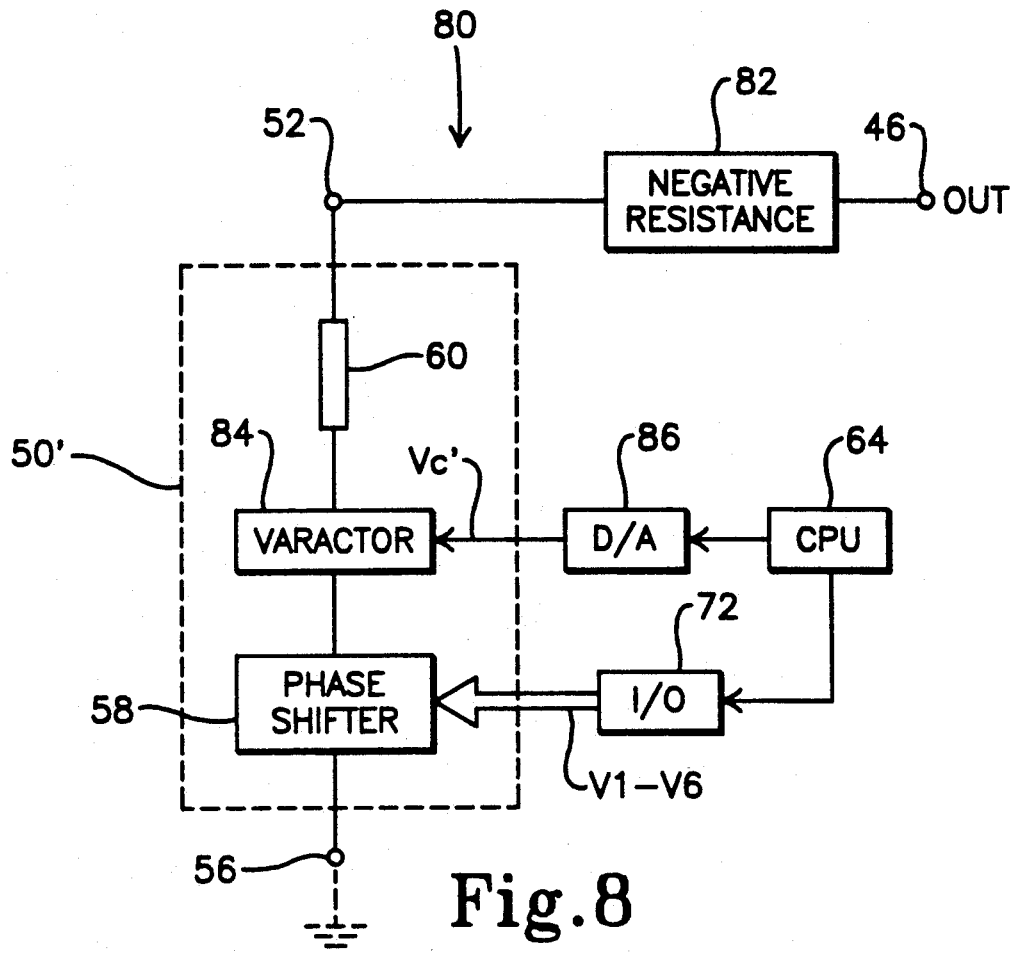
FIG. 8 is a partial circuit diagram illustrating a modified embodiment of the oscillator of FIG. 3 as further including a supplemental analog tuning element.

FIG. 8 illustrates another embodiment of the invention which provides continuous tuning of the oscillator over the entire frequency range. An oscillator 80 includes a modified resonator 50' which is connected to a negative resistance element 82 which can include, for example, an FET or a bipolar transistor. The resonator 50' includes a variable capacitance diode or varactor 84 of the type described above with reference to FIGS. 1 and 2, which is connected in series with the phase shifter 58 and segment 60. The CPU 64 further feeds a digital signal to a DAC 86 which applies a corresponding analog DC control voltage Vc' to the varactor 84.

The phase shifter 58 is controlled in the manner described above with reference to FIGS. 3 and 6. The DAC and varactor 84 are designed to variably set the frequency of the oscillator 80 independently of the phase shifter 58. The frequency increments or steps of the phase shifter 58 may vary somewhat due to nonlinearity. The frequency variation range of the varactor 84 is designed to span the largest frequency increment of the phase shifter 58.

Assuming, for example, that the largest incremental step of the phase shifter 58 is between 9.7 GHz and 10 GHz (an increment of 0.3 GHz), the varactor 84 will be designed to vary the oscillator frequency over a range of 0 to slightly more than 0.3 GHz. Thus, the oscillator frequency at the maximum frequency increment of the phase shifter 58 is continuously variable from (9.7+0 GHz)=9.7 GHz to (9.7+0.3 GHz)=10 GHz, and also between all of the other frequency increments of the phase shifter 58. If all of the frequency increments of the phase shifter 58 are the same, the varactor 83 will be designed to span the single incremental difference.

Figure 9:
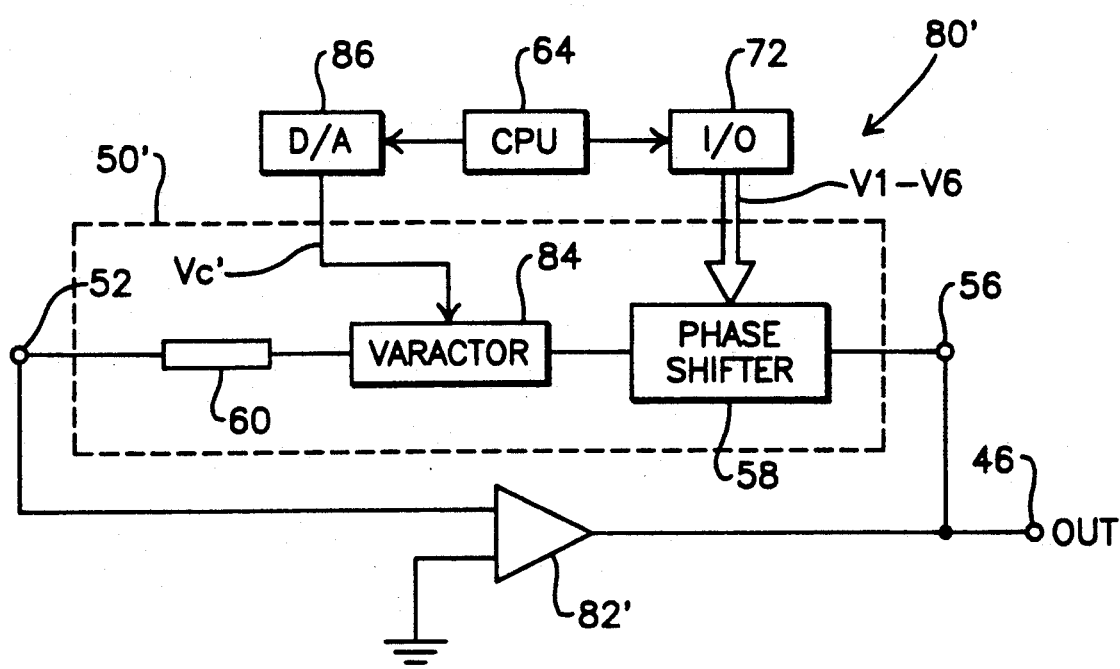
FIG. 9 is similar to FIG. 8, but illustrates the oscillator of FIG. 6 as further including a supplemental analog tuning element.

FIG. 9 illustrates an oscillator 80' which is similar to the oscillator 80, but is arranged in the feedback configuration. In this case, the negative resistance element is an amplifier 82', and the resonator 50' is connected in the feedback path of the amplifier 82'.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. A microwave oscillator, comprising:
   negative resistance means; and
   resonator means connected in circuit with the negative resistance means for producing oscillation at a resonant microwave frequency of the resonator means;
   the resonator means including digital phase shifting means for variably setting said frequency in accordance with an applied digital signal.

2. An oscillator as in claim 1, in which the negative resistance means and resonator means are connected in series.

3. An oscillator as in claim 1, in which the digital phase shifting means is connected as an open-circuit transmission line to the negative resistance means.

4. An oscillator as in claim 3, in which the resonator means further comprises a transmission line segment connected in series with the digital phase shifting means.

5. An oscillator as in claim 1, in which the digital phase shifting means is connected as a short-circuit transmission line to the negative resistance means.

6. An oscillator as in claim 5, in which the resonator means further comprises a transmission line segment connected in series with the digital phase shifting means.

7. An oscillator as in claim 1, in which the negative resistance means and resonator means are connected in parallel.

8. An oscillator as in claim 7, in which:
the negative resistance means comprises an amplifier having an input and an output; and
the resonator means is connected between said input and said output.

9. An oscillator as in claim 8, in which the resonator means further comprises a transmission line segment connected in series with the digital phase shifting means.

10. An oscillator as in claim 1, further comprising computing means for computing a value of said digital signal in accordance with a predetermined function for causing the oscillator to resonate at a selected value of said frequency, and applying said digital signal having said computed value to the digital phase shifting means.

11. An oscillator as in claim 1, further comprising computing means including:
storage means for storing predetermined corresponding values of said frequency and said digital signal;
processing means for accessing the storage means and retrieving a value of said digital signal corresponding to a selected value of said frequency; and
output means for applying said digital signal having said retrieved value to the digital phase shifting means.

12. An oscillator as in claim 1, in which the resonator means further comprises analog phase shifting means for continuously variably setting said frequency in accordance with an applied analog signal independently of the digital phase shifting means.

13. An oscillator as in claim 12, in which the digital phase shifting means and the analog phase shifting means are connected in series.

14. An oscillator as in claim 12, in which:
the digital phase shifting means is configured to variably set said frequency in predetermined increments; and
the analog phase shifting means is configured to variably set said frequency over a largest one of said predetermined increments.

15. A microwave oscillator, comprising:
oscillator circuit means; and
digital phase shifting means connected in circuit for variably setting the frequency of oscillation of the oscillator circuit means.

16. An oscillator as in claim 15, in which the digital phase shifting means is connected as a short-circuit transmission line to the oscillator circuit means.

17. An oscillator as in claim 15, in which the digital phase shifting means is connected as an open-circuit transmission line to the oscillator circuit means.

18. An oscillator as in claim 15, in which the digital phase shifting means is connected in a positive feedback path of the oscillator circuit means.

19. An oscillator as in claim 15, further comprising analog phase shifting means for continuously variably setting said frequency independently of the digital phase shifting means.

20. An oscillator as in claim 19, in which:
the digital phase shifting means is configured to variably set said frequency in predetermined increments; and
the analog phase shifting means is configured to variably set said frequency over a largest one of said predetermined increments.

* * * * *